United States Patent
Fox et al.

(10) Patent No.: US 8,617,651 B2
(45) Date of Patent: Dec. 31, 2013

(54) LOW WORK FUNCTION DIAMOND SURFACE AND RADIATION ENERGY CONVERTERS USING SAME

(75) Inventors: Neil Fox, Cheltenham (GB); Tomas Liam Martin, Bristol (GB); Kane Michael O'Donnell, New South Wales (AU)

(73) Assignee: The University of Bristol, Bristol (GB)

( * ) Notice: Subject to any disclaimer, the term of this patent is extended or adjusted under 35 U.S.C. 154(b) by 45 days.

(21) Appl. No.: 13/304,499

(22) Filed: Nov. 25, 2011

(65) Prior Publication Data

US 2012/0244281 A1 Sep. 27, 2012

(30) Foreign Application Priority Data

Nov. 25, 2010 (GB) .................................. 1019967.7

(51) Int. Cl.
*C23C 16/00* (2006.01)
(52) U.S. Cl.
USPC .......................................................... 427/250
(58) Field of Classification Search
USPC .......................................................... 427/250
See application file for complete search history.

(56) References Cited

U.S. PATENT DOCUMENTS

| | | | | |
|---|---|---|---|---|
| 6,064,137 A | * | 5/2000 | Cox | 310/306 |
| 6,103,298 A | * | 8/2000 | Edelson et al. | 427/77 |
| 2006/0261719 A1 | * | 11/2006 | Fox | 313/311 |

OTHER PUBLICATIONS

Wong et al. Negative electron affinity on polycrystalline diamond surface induced by lithium fluoride deposition, Diamond and Related Materials 8 (1999) pp. 1885-1890.*
Petrick et al. Potassium adsorption on hydrogen- and oxygen-terminated diamond (100) surfaces, Diamond and Related Materials 10 (2001) pp. 519-525.*
Loh et al. A spectroscopic study of the negative electron affinity of cesium oxide-coated diamond (111) and theoretical calculation of the surface density-of-states on oxygenated diamond (111), Diamond and Related Materials 11 (2002) pp. 1379-1384.*

* cited by examiner

*Primary Examiner* — Kelly M Gambetta
(74) *Attorney, Agent, or Firm* — Huffman Law Group, P.C.

(57) ABSTRACT

A surface with a low work function is formed from a starting material of diamond or diamond-like carbon. An oxygenation treatment is performed, so that the surface of the diamond or diamond-like carbon is oxygenated. Lithium is then deposited onto the oxygenated surface by means of a physical vapour deposition process. Excess lithium is then removed to form a lithium monolayer.

18 Claims, 10 Drawing Sheets

LOW WORK FUNCTION DIAMOND SURFACE AND RADIATION ENERGY CONVERTERS USING SAME

This invention relates to a low work function surface, and in particular to a method for producing the low work function surface, on any material electrode that incorporates a diamond or diamond-like particle layer or coating. The invention further relates to energy conversion devices, for converting radiation energy to electrical energy.

Thermionic energy conversion devices which convert heat energy into useful electrical energy are well known and described. For example, the articles "Measured Thermal Efficiencies of a Diode Configuration of a Thermo Electron Engine of a Thermo Electron Engine", Hatsopoulus and Kaye, MIT, Journal of Applied Physics, 1958, pages 1124 to 1125, and "Theoretical Efficiency of the Thermionic Energy Converter", Houston, GE Research Laboratory, NY, Journal of Applied Physics, vol. 30, No. 4, April 1959, both describe thermionic emission devices having a cathode emitter spaced apart from an anode collector. The cathode emitter emits electrons when heated, and these electrons are collected by the collector, thereby giving an electrical current. However, such devices have been found to be inefficient in their energy conversion. In particular, such devices only operate at high temperatures, typically 1000° C. to 1500° C.

Accordingly, attempts have been made to improve the efficiency, mainly by changing the structure of the cathode emitter. Such an approach is described in U.S. Pat. No. 5,981,071, and in its divided U.S. Pat. No. 6,214,651. These patents disclose the use of nitrogen-doped carbonaceous material for the emitter electrode. Since the devices described are primarily intended for cooling semiconductor devices, the efficiency of energy conversion is low. Indeed, the use of nitrogen as a dopant leads to a low electrical conductivity, and a high work function for the material. A high work function means that electron emission is restricted and undesirably low. Accordingly, it is desirable to provide an energy conversion device based on thermionic electron emission techniques, but which has higher, and, hence, more useful, conversion efficiency. It is also desirable to provide a device which is able to operate successfully at lower temperatures than previous devices, for example, at 500° C. or lower.

All thermionic devices are based upon the Richardson equation, which gives the current per unit area, $J_R$, emitted by a metal surface with a work function $\phi_e$, at a temperature $T_e$, as:

$$J_R(\phi_e, T_e) = A \cdot T_e^2 \cdot e^{-e\phi_e/k_B T_e} \quad (1)$$

where A, in turn, is a constant given by:

$$A = \frac{emk_B^2}{2\pi^2\left(\frac{h}{2\pi}\right)^3} \approx -120 \, A \cdot cm^{-2} \cdot K^{-2}.$$

A typical thermionic generator might operate at T=1500K with a caesium metal surface whose work function $\phi_e$ is about 2 eV. Using these values gives $J_R$=52 A/cm².

The efficiency of a thermionic diode converter is given by the relation:

$$\eta = \frac{(\phi_e - \phi_c)}{\{\phi_e + 2kT_e + (\sigma\varepsilon_e T_e^4 - \sigma\varepsilon_c T_c^4)J_s^{-1} + Q_e J_s^{-1}\}} \quad (2)$$

where $\phi_c$ and $\phi_e$ are respectively the work functions of the emitter and the collector, $T_e$ and $T_c$ are respectively the temperatures of the emitter and collector, $\sigma$ is the Stefan-Boltzmann constant, $Q_e$ is the thermal energy loss per second from the emitter via the electrical conductors, and $J_s$ is the Richardson saturation current of the emitter. The efficiency according to this equation is reduced due to radiation loss and thermal conductivity of the conductors.

Thus, it can be seen that the work function and temperature of the emitter are the key parameters determining the operational performance of a thermionic emitter, while a collector with a lower work function than the emitter can significantly boost efficiency.

Adsorbates have been widely studied for their role in changing the chemical, physical and electrical properties of diamond. In particular, certain surface terminations, or deposited surface layers, on diamond induce a negative electron affinity (NEA) property, in which the conduction band sits above the vacuum level. These offer a number of potential device applications, including in low threshold electron emission, photodetection and electrochemical cells.

Hydrogen termination is common on chemical vapour deposition (CVD) grown diamond and has been widely observed to induce an NEA on both the C(100) [see J. van der Weide, et al., Phys. Rev. B 50, 5803 (1994)] and C(111) [see C. Bandis et al., Phys. Rev. B 52, 12056 (1995)] surfaces. Together, the C(111) and C(100) surfaces comprise the majority of surfaces on natural and high pressure, high temperature (HPHT) diamond particles, as well as the surfaces of CVD films. Experimental observations of hydrogen termination show an NEA of around −1.3 eV [see L. Diederich, et al., Surf. Sci. 424, L314 (1999)], shifting the bare work function of diamond from 5.5-6 eV down to 2.85-3.9 eV. More unusual surface coatings, such as rubidium fluoride [see K. Wong, et al., Appl. Surf. Sci. 140 144 (1999)] and caesium oxide [see M. Geis, et al., Appl. Phys. Lett. 67, 1328 (1995)], have also been observed to induce an NEA on diamond. In the case of caesium oxide, the deposition of a caesium sub-monolayer on an oxygenated diamond surface lowers the work function to as little as 1.25 eV, making low threshold emission a real possibility. Unfortunately, this surface layer is only weakly bound to the diamond surface, and is totally removed at a temperature of 400° C.

The inventors have discovered and recently reported [see K. M. O'Donnell, et al., Phys. Rev. B 82, 115303 (2010)] ab initio density functional theory calculations that show that a lithium monolayer on oxygen-terminated diamond can form an NEA comparable to CsO in strength, but with a much higher theoretical binding energy of around 4.7 eV per lithium atom adsorbed onto the C(100) surface, and a work function shift of −4.52 eV.

According to a first aspect of the present invention, there is provided a method of forming a surface having a low work function, the method comprising:
   on a surface of diamond or diamond-like carbon, performing an oxygenation treatment to form an oxygenated surface;
   performing a physical vapour deposition of lithium onto the oxygenated surface; and
   removing excess lithium to form a lithium monolayer.

Thus, embodiments of the invention provide a method for producing temperature stable, low work function surfaces on diamond coated electrodes. This means that the invention may be advantageously applied to the fabrication of many types of vacuum device employing such electrodes to significantly improve the efficiency with which they produce a source of electrons. For example, the thermionic cathodes of energy converters, and the collector electrode within the same, can be made to exhibit enhanced operation by making use of the large, stable negative electron affinity to mitigate space charge, and the correspondingly lower work function to reduce the threshold for thermionic emission, and increase the secondary yield of radiation induced energy conversion.

For a better understanding of the present invention, and to show how it may be put into effect, the invention will now be described with reference to the accompanying drawings, in which:—

Figure 1:
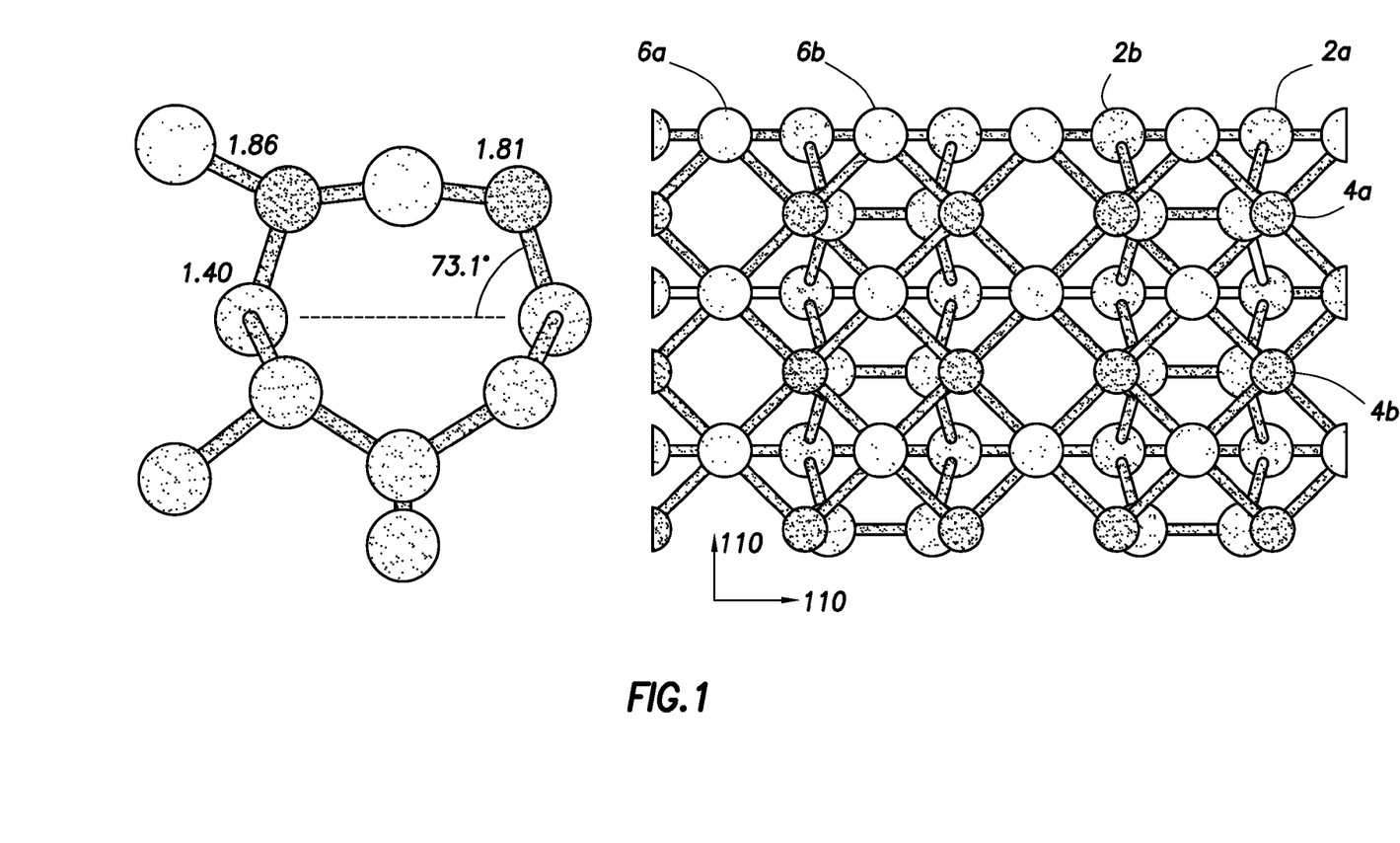
FIG. 1 illustrates the C(100) surface of diamond and showing a model prediction of the most stable coordination of a monolayer of lithium on an oxygen-terminated surface.

FIG. 1 shows the lowest energy (i.e. most stable) structure (as calculated by Density Functional Theory (DFT) modeling) for a full monolayer of lithium adsorbed onto an oxygenated surface of diamond on the C(100)-(1×1):O structure. In FIG. 1, grey spheres 2a, 2b, etc represent carbon atoms, black spheres 4a, 4b, etc represent oxygen atoms and white spheres 6a, 6b, etc represent lithium atoms.

Figure 2:
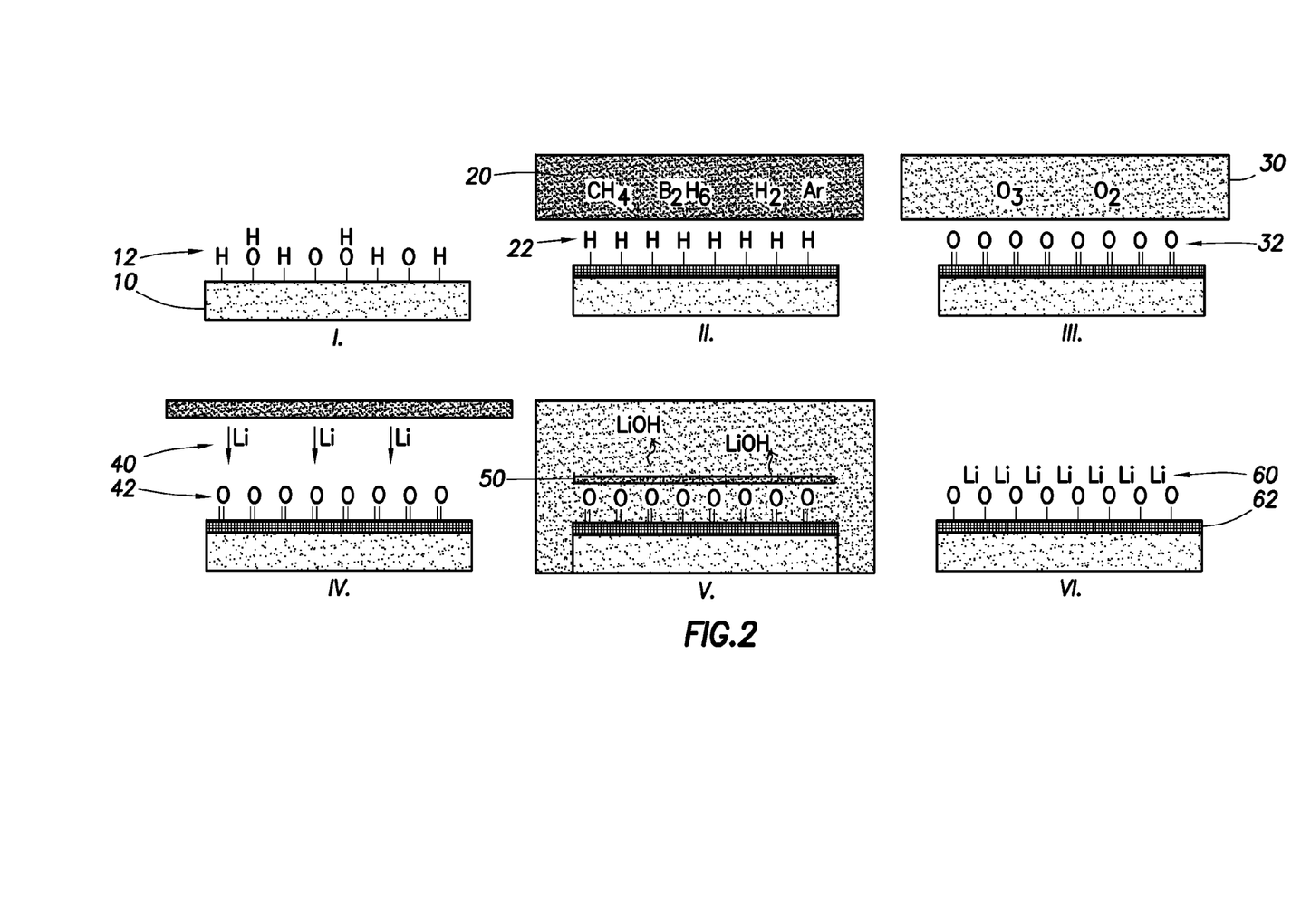
FIG. 2 shows the process steps used to produce a low work function surface on conductive diamond.

FIG. 2 illustrates a lithium deposition process in accordance with an aspect of the invention.

Specifically, FIG. 2(I) shows the initial as-received surface. The substrates 10 used in this method are free standing C(100) single crystal diamond squares, formed by chemical vapour deposition (CVD), with dimensions 2.6×2.6×0.5 mm, obtained commercially from Element Six™. FIG. 2(I) shows that the surface 12 is initially terminated randomly by hydrogen, oxygen and hydroxide.

In other embodiments, the starting material can be a material having a surface in the form of a semiconducting diamond layer, a nanoparticle diamond layer, a metal-diamond composite, diamond thin films, diamond-like carbon materials, or other carbon-containing materials functionalised with $sp^3$ bonding, such as graphene.

FIG. 2(II) shows the growth, via Microwave Plasma Enhanced Chemical Vapor Deposition (MW-PECVD) of a boron-doped overlayer. Specifically, the boron-doped overlayer can be grown in a microwave plasma system at a pressure of 150 Torr, with an atmosphere 20 of 500 standard cubic centimeters per minute (sccm) of hydrogen, 25 sccm of methane, 40 sccm of argon and 0.5 sccm of boron precursor, consisting of 5% diborane ($B_2H_6$) in hydrogen.

A growth plasma was ignited at a microwave power of 1.25 kW, with a substrate temperature of 720° C. and a growth time of two hours, resulting in an overlayer thickness of approximately 4 μm. After growth, the samples were treated in a hydrogen plasma for two minutes at 60 Torr and 1 kW microwave power with only the hydrogen gas present, at a sample temperature of 600° C., resulting in a hydrogen termination 22.

Although FIG. 2(II) shows the production of a boron-doped overlayer, it is equally possible to form phosphorus-doped samples, which can be made by a similar method with diborane being replaced by phosphine gas ($PH_3$). Similarly, the hydrogenation may not be required, depending on the intended application.

Forming the boron-doped, or phosphorus-doped, produces a conductive diamond layer, which is preferable for the correct operation of thermionic electrodes that would use the final lithiated surface. Instead of the p-type overlayer used here, an n-type material can be used for efficient electrode operation, and potential elemental dopants would include nitrogen, aluminium, phosphorus and lithium. Mixtures of dopants are also possible, such as nitrogen and lithium. In other applications, for example in radiation detectors, the final negative electron affinity (NEA) surface could be used without a doped layer, and could instead derive carrier conduction from excitation processes associated with the radiation interacting with the diamond.

FIG. 2(III) illustrates the step of forming oxygen termination on the surface. In this illustrated example, ozone cleaning of the surface is used for oxygen termination. In other embodiments, other techniques can be used. For example, the surface can be treated with high frequency oxygen plasma, or with fuming aqua regia at, say, 130° as an acid treatment. Specifically, in the illustrated embodiment, samples are subjected to an acid wash in fuming nitric acid for one hour, followed by thirty minutes exposure to UV-excited ozone 30 in a UVO™ ozone cleaner. After this oxygenation treatment, an oxygen-terminated surface 32 was formed. This can be shown by the fact that the contact angle on the diamond surface changed markedly from around 60 degrees for the hydrogenated surface 22 to 30 degrees for the oxygenated surface 32, indicating the expected change from the hydrophobic hydrogen-terminated surface to the hydrophilic oxygenated surface. In addition, X-ray photoemission spectroscopy (XPS) of the as-grown and ozone treated surface showed a change in the C/O ratio of 47.7 to 17.7 when comparing the normalized height intensities of the C 1s and O 1s XPS spectra. In addition to the increase in intensity, the O 1s peak position moved from 532.8 to 532.2 eV, indicating an increase in negative charge on the oxygen, from predominately single bonded oxygen or hydroxides to double bonded oxygen. Similarly, a shoulder appeared on the C 1s peak at 287 eV after ozone treatment, indicating the presence of C—O—C or C=O bonds on the surface.

FIG. 2(IV) shows the deposition of lithium 40 onto the oxygen terminated diamond surface 42. Specifically, atomic lithium can be deposited using thermal evaporation of lithium metal in a Balzer 510™ coater at a pressure of $5 \times 10^{-6}$ Torr. This results in a lithium thickness, estimated using a quartz crystal monitor, of approximately 50 nm. The samples can then be removed from the chamber and stored in an oxygen-free argon gas ambient.

FIG. 2(V) shows the washing of the excess lithium from the surface 50 for five minutes with a mixture of de-ionised (DI) water and isopropanol (IPA) to remove excess lithium metal and lithium compounds (such as LiOH, shown in FIG. 2(V))

from the surface. The samples can then be baked under vacuum at 500° C. for at least 1 hour to remove any traces of water contamination.

FIG. 2(VI) represents the final expected product, with a lithium layer 60 on the oxygen-treated surface 62 of the diamond.

Thus, the process as described above involves physical vapour deposition of lithium, to excess, onto an oxygen terminated diamond surface, followed by removal of the excess lithium.

As an alternative, it would be possible to deposit a monolayer of lithium.

As a further alternative, the lithium can be deposited by means of an electrochemical or chemical vapour deposition technique.

It has been found by making experimental measurements recorded using X-Ray Photoemission Spectroscopy (XPS), and Ultra violet Photoemission Spectroscopy (UPS), that both p-type (illustrated in FIG. 3) and n-type (illustrated in FIG. 6) diamond samples prepared according to the method described above exhibit strong NEA properties, indicative of a lower effective work function surface. Specifically, the experimentally measured values obtained for lithium on C(100):O give a NEA value of −3.0 eV and a work function value of 2 eV, which are in reasonable agreement with the model predictions.

Furthermore, the method described above is equally effective on both C(100) and C(111) oriented single crystal surfaces.

Compared with the methods currently employed to form and activate monolayers of alkali metals on metal or semiconductor surfaces, the method described above is found to be simpler and more effective.

Subsequent XPS analysis confirmed that no hydrogen remained on the surface after the baking procedure.

It has been observed that post analysis, the lithium mono layer on ozone treated diamond is air stable. If necessary, for example if the surface is left in conditions in which it can absorb atmospheric water vapour, it can be reactivated by heating in vacuum or inert gas. Although a similar observation of apparent air stability has been made by Geis for caesium-treated surfaces, oxygen terminated diamond, the reproducibility of this effect is poor because unlike a lithium treated surface a sub monolayer of caesium is required for achieving a low work function surface, whereas a lithium-treated surface achieves a superior result with a full monolayer due the advantageous manner in which the oxygen and (smaller) lithium atom accommodated in the top surface layer of the diamond surface.

FIG. 3 shows various photoemission spectroscopy results that illustrate the process. FIG. 3(a) shows Ultraviolet photoemission spectroscopy (UPS) results from a p-type C(100)-(1×1):O surface, with a first plot 70 showing the Positive Electron Affinity of the oxygen terminated surface illustrated in FIG. 2(III), and a second plot 72 showing the strong Negative Electron Affinity peak from the lithiated surface resulting from the process of FIG. 2.

Figure 3A:
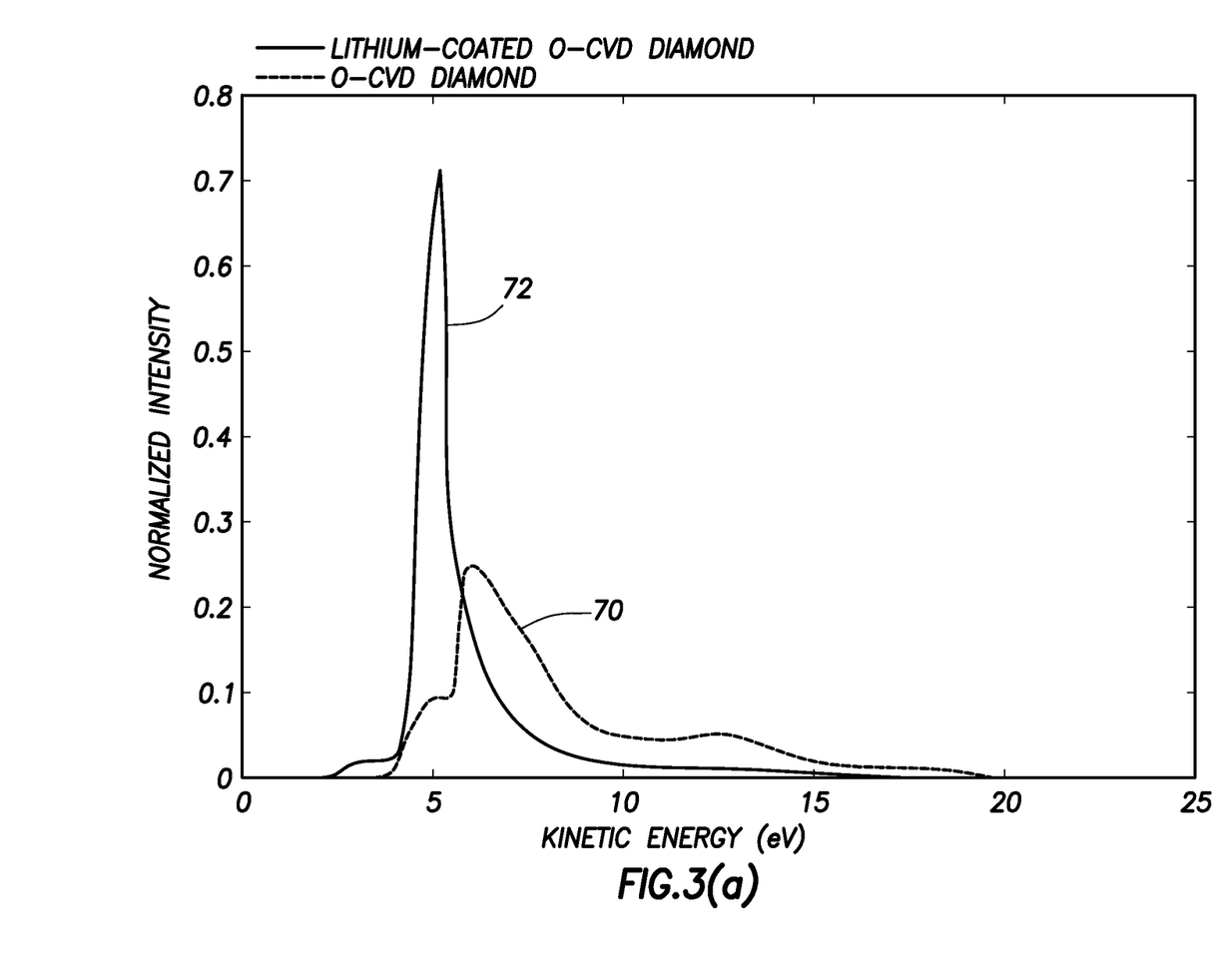
FIG. 3 shows X-Ray Photoemission Spectroscopy and Ultraviolet Photoemission Spectroscopy measurements of a lithium monolayer on oxygen-terminated, C(100) oriented, p-type, single crystal diamond.
Figure 3B:
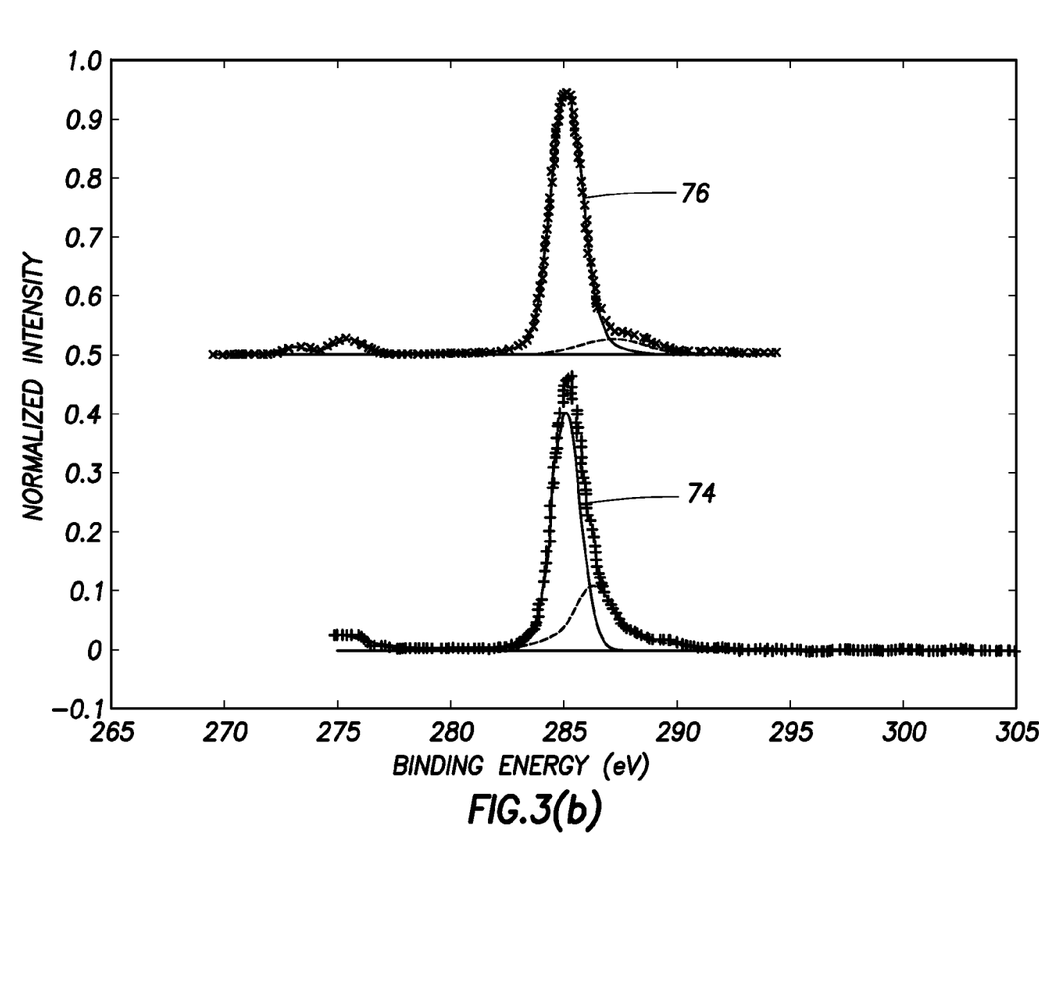
Figure 3C:
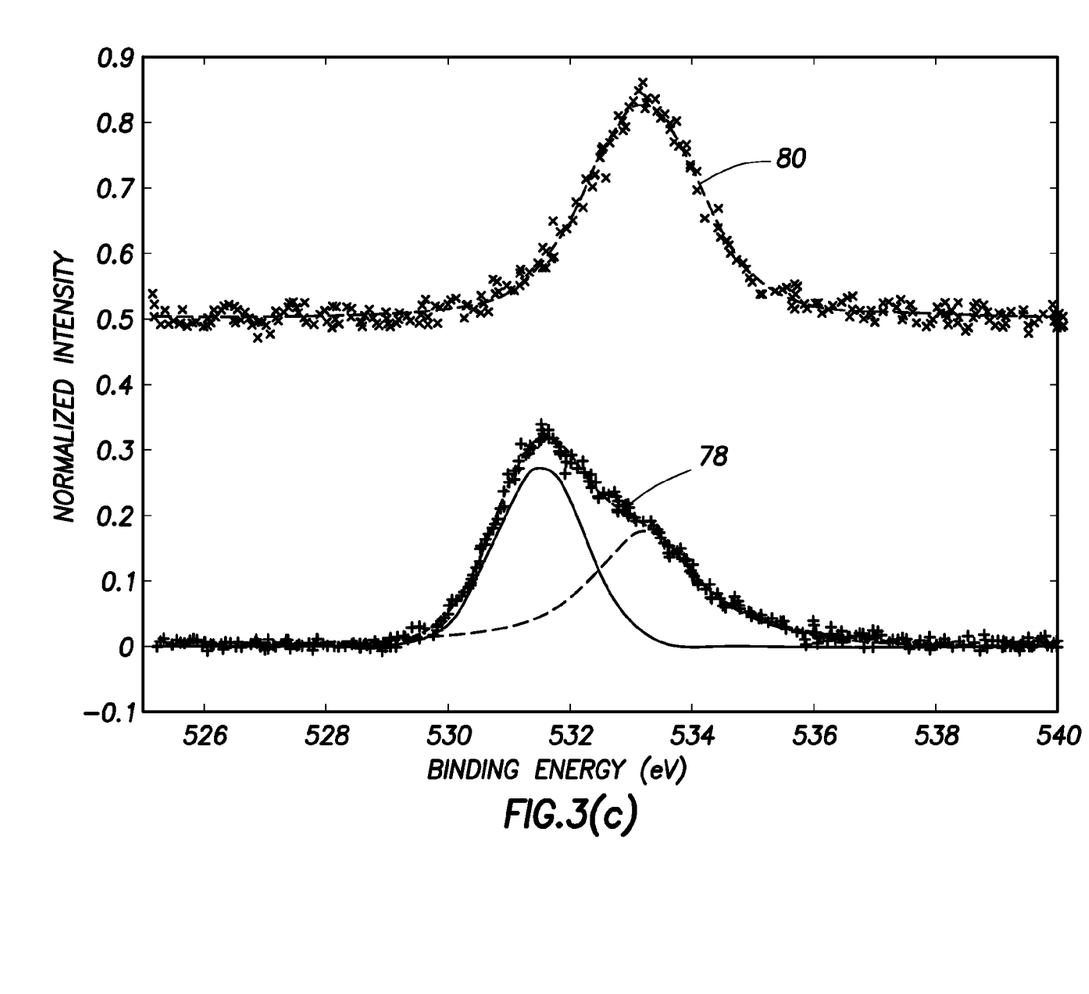
Figure 3D:
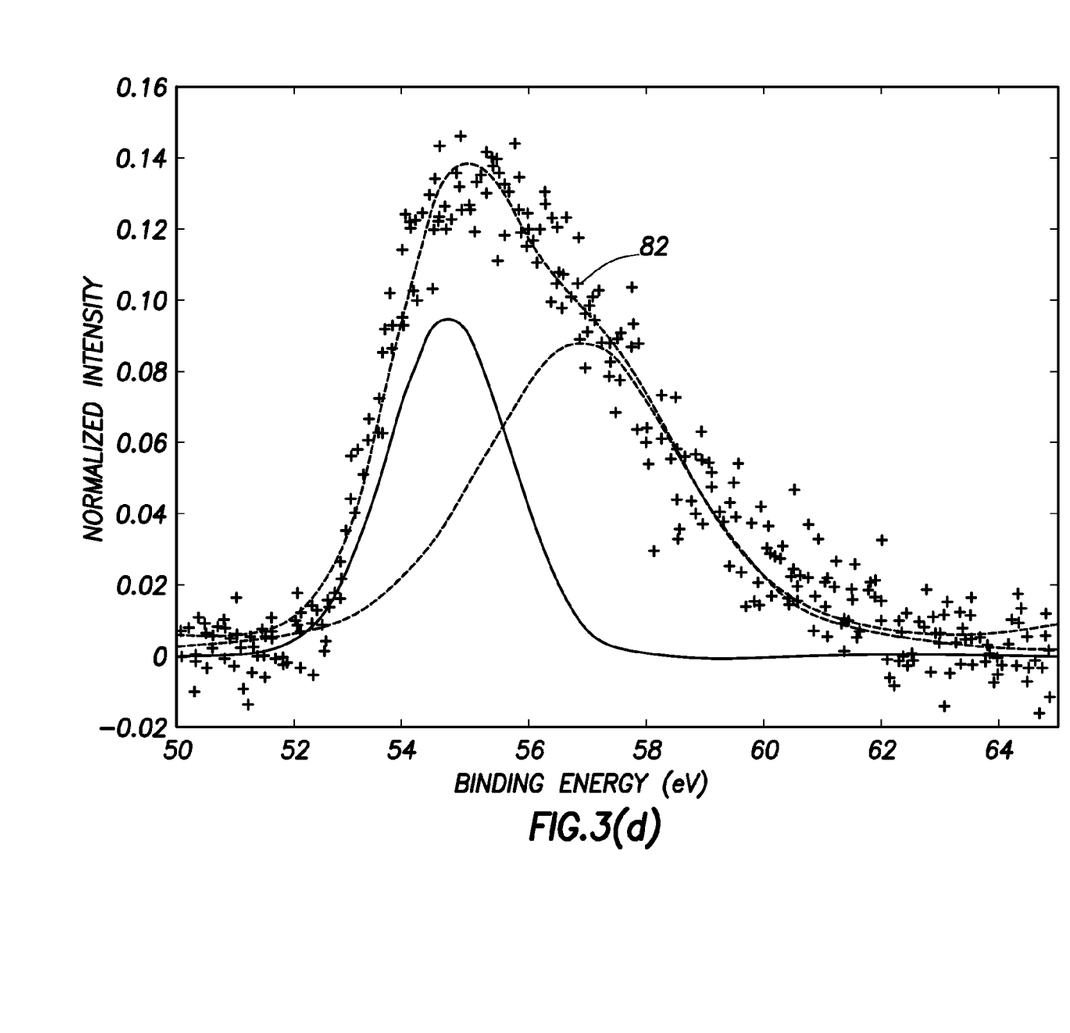

FIGS. 3(b), 3(c) and 3(d) are three X-Ray photoemission spectroscopy (XPS) plots showing the effects of lithium oxide formation. Thus, FIG. 3(b) contains plots 74, 76, showing respectively the spectra of the diamond carbon 1S core level of the oxygen terminated surface illustrated in FIG. 2(III), and the lithiated surface. FIG. 3(c) contains plots 78, 80, showing respectively the spectra of the Oxygen 1S in the oxygen terminated surface illustrated in FIG. 2(III), and the lithiated surface. FIG. 3(d) contains a plot 82, showing the Lithium 1S core level spectrum in the lithiated surface.

Figure 4A:
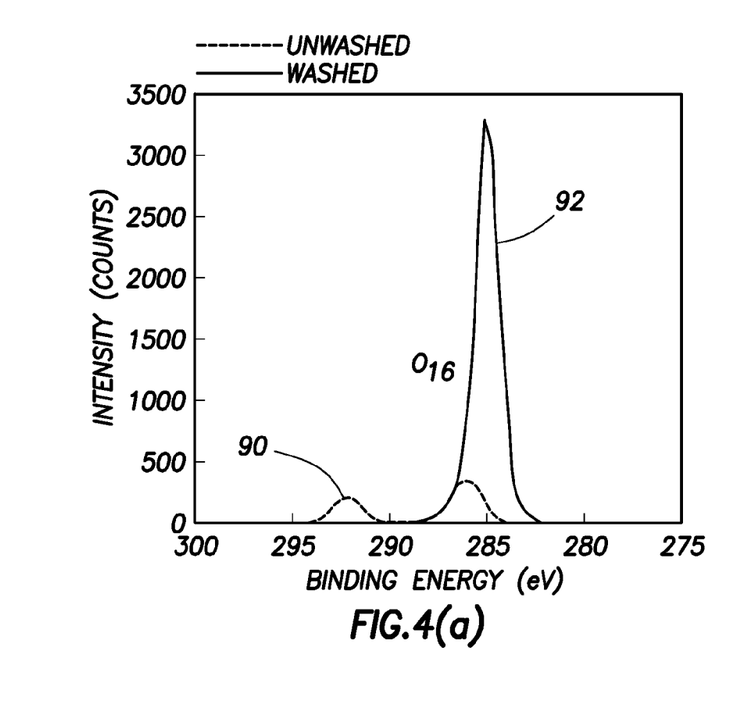
FIG. 4 is an X-Ray Photoemission Spectroscopy measurement showing the effects of washing a lithium-coated diamond surface to reveal a lithium monolayer on diamond.
Figure 4B:
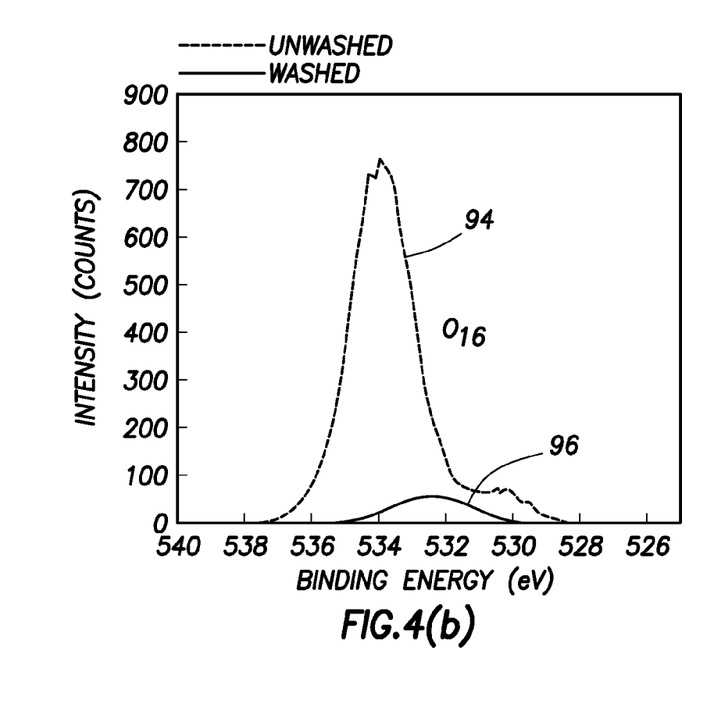

FIGS. 4(a) and 4(b) show XPS plots obtained from the lithium coated surface (i.e. C(100):O:Li) before and after the water washing step illustrated in FIG. 2(V) that is used to produce the lithium monolayer on diamond surface. More specifically, FIG. 4(a) shows a plot 90 obtained before the water washing and a plot 92 obtained after the water washing, in the binding energy range corresponding to carbon bonding, while FIG. 4(b) shows a plot 94 obtained before the water washing and a plot 96 obtained after the water washing, in the binding energy range corresponding to oxygen bonding. It can thus be seen that removing the excess lithium has the effect of weakening the oxygen signal, because some oxygen is also removed as lithium oxide. It also has the effect of strengthening the carbon signal, because the layer of lithium and oxygen retained on the carbon surface is much thinner.

Figure 5:
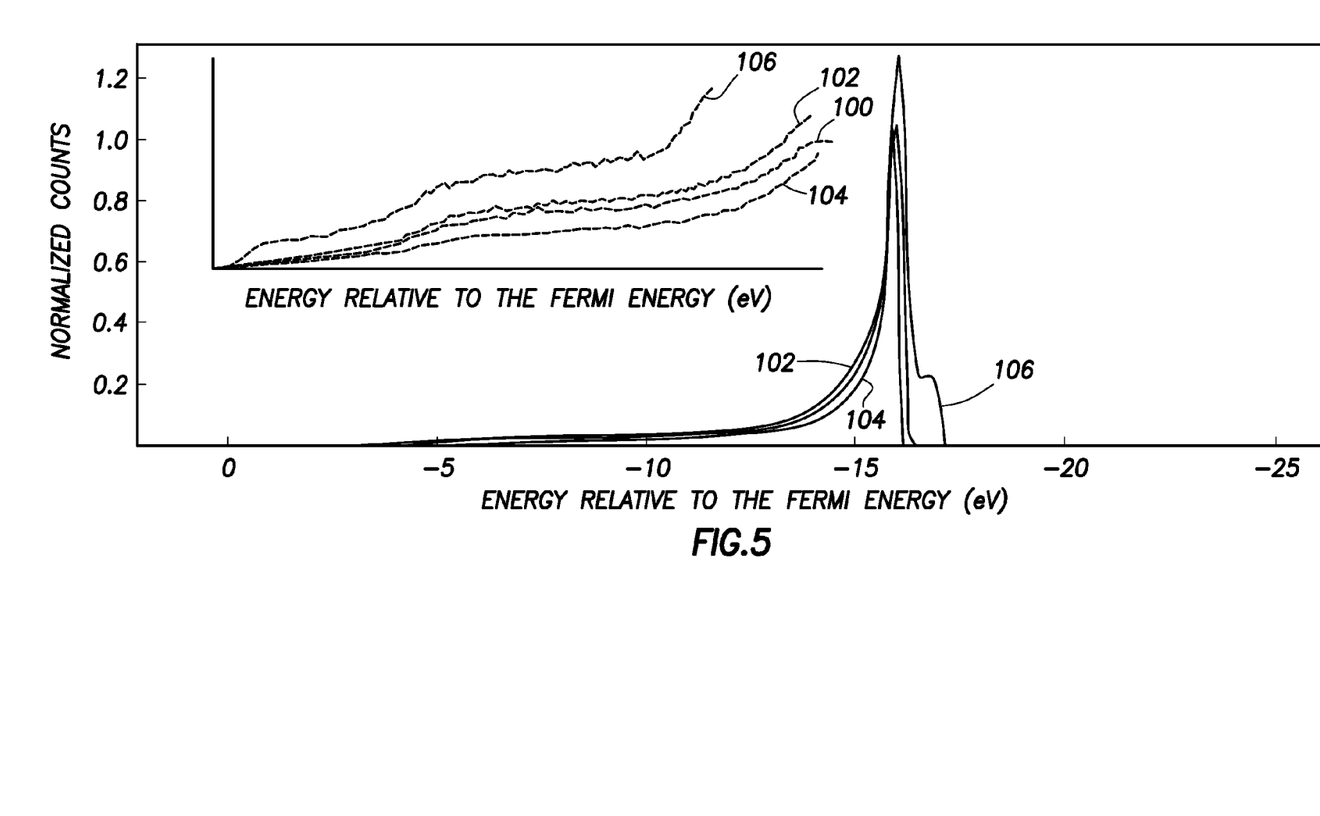
FIG. 5 is an Ultraviolet Photoemission Spectroscopy measurement showing a temperature stability of an NEA surface on p-type diamond.

FIG. 5 shows Ultraviolet photoemission spectroscopy (UPS) results obtained from a lithium coated, p-type C(100):O material prepared as described above after being washed in water wash, and after heating in steps to high temperatures, to illustrate the temperature stability of the final material, with plot 100 showing the result after heating to 925° C., plot 102 showing the result after heating to 1012° C., plot 104 showing the result after heating to 1140° C., and plot 106 showing the result after heating to 1218° C., with the inset showing enlarged the region where the spectra cut off.

Thus, it can be seen that the material produced as described herein has a stable NEA condition when the temperature is elevated above room temperature. Specifically, it is found (as shown in FIG. 5) that there is no significant desorption of the lithium surface until the diamond surface attains 1140° C. This attribute is particularly advantageous for radiation energy converters that need to operate reliably at temperatures above 400° C.

Figure 6:
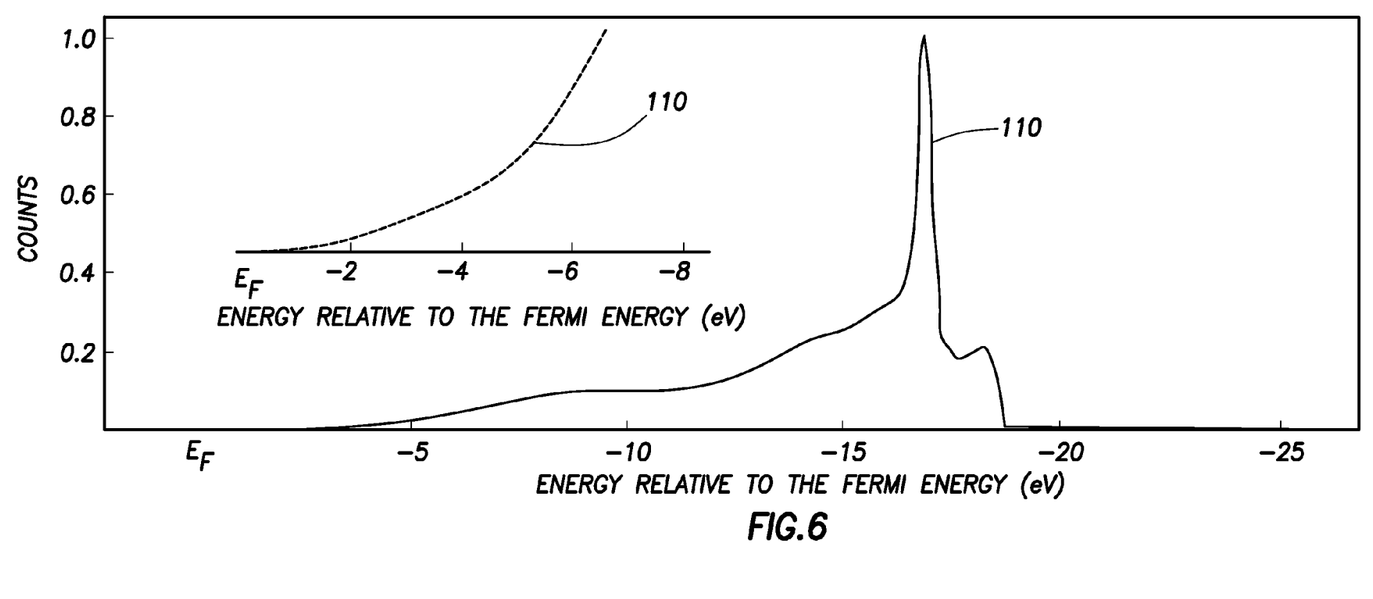
FIG. 6 is an Ultraviolet Photoemission Spectroscopy measurement showing an NEA formed on n-type, C(111) diamond using the method illustrated in FIG. 2.

FIG. 6 shows Ultraviolet photoemission spectroscopy (UPS) results obtained from a lithium coated, n-type C(100):O material prepared as described above, i.e. with phosphorus doping used to produce a conductive diamond surface. Again, the plot 110 shows a strong NEA, with the inset showing enlarged the region where the spectrum cuts off.

Figure 7:
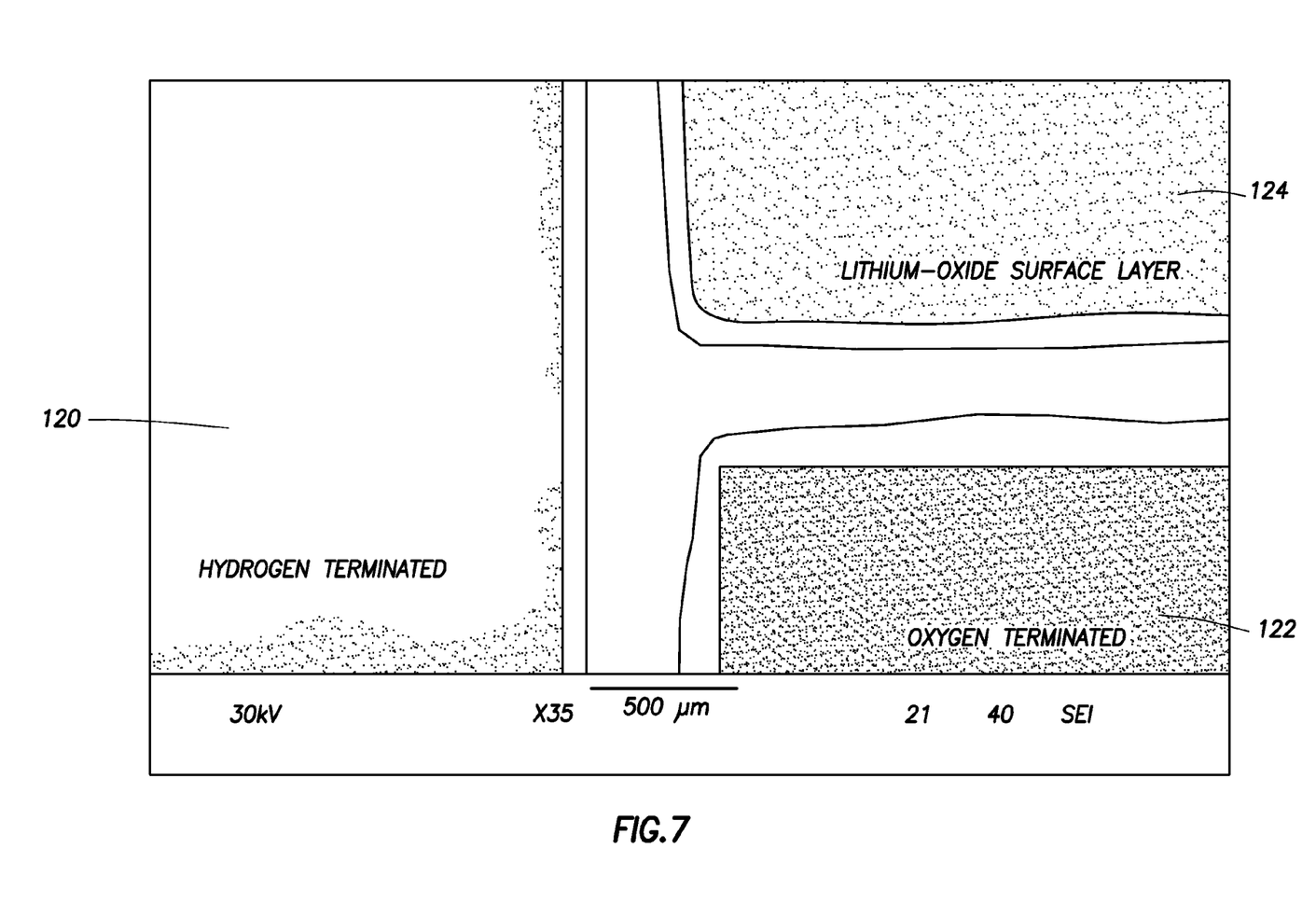
FIG. 7 is a Secondary Electron Emission Image taken in an electron microscope at room temperature, showing three diamond surfaces with hydrogen, oxygen and oxygen-lithium terminated surfaces.

FIG. 7 is a Secondary Electron Emission Image taken in an electron microscope at room temperature showing a diamond material having regions with a hydrogen terminated surface 120, an oxygen terminated surface 122, and an oxygen-lithium terminated surface 124. This shows that the lithium coated, n-type C(100):O surface 124 with a strong NEA produces as many secondary electrons as the hydrogen terminated NEA surface 120.

The invention has been described so far as involving the use of lithium on the surface of the material. However, the same method can be used with magnesium instead of lithium, as the small size of the magnesium atom means that it can form a structure very similar to that shown in FIG. 1, with resulting advantageous properties.

Surface with low work functions, as described above, can be used in a variety of applications, for example in:

thermionic solar energy converters, using concentrated solar power;

photomultiplier tube, for forming one or more of the dynodes;

Scanning Electron Microscopes as a cold or thermionic field emission source, in particular because the material can act as an electron source with a narrow energy spread, allowing higher image resolution to be realised at lower cost than in a conventional field emission microscope;

low power portable X-ray sources, making use of high current low temperature thermionic electron sources to excite X-rays from metals for medical, scientific and home security;

high power thermionic valves and microwave amplifiers (Travelling Wave Tubes);

ion-gated FETS, in which a low work function surface which is chemically sensitive can use to measure pH, or as a chemical sniffer;

micro-plasma arrays working at up to atmospheric pressure for sterilisation, gas cleaning, light sources for photochemistry, or ion propulsion.

There is thus described a method for producing a low work function surface that exhibits high temperature and chemical stability.

The invention claimed is:

1. A method of forming a surface having a low work function, the method comprising:
   on a surface of diamond or diamond-like carbon, performing an oxygenation treatment to form an oxygenated surface;
   performing a physical vapour deposition of lithium onto the oxygenated surface; and
   washing the surface in water to remove excess lithium to form a lithium monolayer.

2. A method as claimed in claim 1, wherein the step of performing the physical vapour deposition of lithium comprises depositing the lithium under vacuum.

3. A method as claimed in claim 1 or 2, wherein the step of washing the surface in water to remove excess lithium comprises removing lithium such that the remaining lithium forms a monolayer of atoms chemically bound to the oxygenated surface over a substantial part of the surface.

4. A method as claimed in claim 1, comprising removing hydrogen from said surface before performing the oxygenation treatment.

5. A method as claimed in claim 1, wherein the step of forming the oxygenated surface comprises treating the surface with ozone to form an oxygen termination layer.

6. A method as claimed in claim 1, wherein a starting material comprises a single crystal diamond.

7. A method as claimed in claim 6, further comprising doping the starting material with a dopant material selected from the group comprising boron, phosphorous, lithium, nitrogen, and aluminium, and combinations including at least one material selected from said group.

8. A method as claimed in claim 6, comprising doping the starting material with boron.

9. A method of forming a surface having a low work function, the method comprising:
   forming an oxygen termination layer on a surface of a starting material, wherein the starting material is a carbon-containing material with $sp^3$ bonding;
   treating the surface with a metal, wherein the metal is selected from the group comprising lithium and magnesium;
   wherein the step of treating the surface with the metal comprises depositing the metal, and subsequently removing excess metal by washing the surface in water such that the remaining metal forms a monolayer of metal atoms chemically bound to the oxygen termination layer over a substantial part of the surface.

10. A method as claimed in claim 9, wherein the step of treating the surface with the metal comprises depositing the metal under vacuum.

11. A method as claimed in claim 9, wherein the starting material is selected from the group comprising diamond, diamond-like carbon, and graphene.

12. A method as claimed in claim 9, wherein the starting material comprises a semiconducting diamond layer.

13. A method as claimed in claim 9, wherein the starting material comprises a nanoparticle diamond layer.

14. A method as claimed in claim 9, wherein the starting material comprises a metal-diamond composite.

15. A method as claimed in claim 9, wherein the starting material comprises diamond thin films.

16. A method as claimed in claim 9, wherein the starting material comprises a single crystal diamond.

17. A method as claimed in claim 9, wherein the step of forming the oxygen termination layer comprises, as an initial step, removing hydrogen from the surface.

18. A method as claimed in claim 9, further comprising doping the starting material with a dopant material selected from the group comprising boron and phosphorus.

* * * * *